(12) United States Patent
Khan

(10) Patent No.: US 8,386,885 B1
(45) Date of Patent: Feb. 26, 2013

(54) USING ECC MEMORY TO STORE CONFIGURATION INFORMATION

(75) Inventor: Ata Khan, Saratoga, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 300 days.

(21) Appl. No.: 12/869,649

(22) Filed: Aug. 26, 2010

Related U.S. Application Data

(60) Provisional application No. 61/237,266, filed on Aug. 26, 2009.

(51) Int. Cl.
*G11C 29/00* (2006.01)
(52) U.S. Cl. .......................... 714/763; 714/773
(58) Field of Classification Search ................. 714/763, 714/773
See application file for complete search history.

(56) References Cited

U.S. PATENT DOCUMENTS

| | | | |
|---|---|---|---|
| 5,961,660 A | 10/1999 | Capps, Jr. | |
| 7,117,421 B1 * | 10/2006 | Danilak | 714/763 |
| 7,143,329 B1 | 11/2006 | Trimberger et al. | |
| 7,269,679 B1 | 9/2007 | Cho et al. | |
| 7,428,689 B2 | 9/2008 | Wallner et al. | |
| 7,487,428 B2 | 2/2009 | Co et al. | |
| 7,870,472 B2 | 1/2011 | Thorp et al. | |
| 8,239,732 B2 * | 8/2012 | Tan et al. | 714/765 |
| 2008/0065937 A1 | 3/2008 | Micheloni et al. | |
| 2008/0209282 A1 * | 8/2008 | Lee et al. | 714/54 |
| 2009/0031194 A1 | 1/2009 | Bellipaddy et al. | |
| 2009/0049364 A1 * | 2/2009 | Jo et al. | 714/763 |
| 2009/0070651 A1 | 3/2009 | Diggs et al. | |
| 2009/0164704 A1 * | 6/2009 | Kanade et al. | 711/103 |
| 2010/0293440 A1 * | 11/2010 | Thatcher et al. | 714/764 |

OTHER PUBLICATIONS

Sun et al., "Run-Time Data-Dependent Defect Tolerance for Hybrid CMOS/Nanodevice Digital Memories," IEEE vol. 7 Issue 2, Mar. 2008, pp. 217-222; 6 pages.

Qin et al., "SafeMem: Exploiting ECC-Memory for Detecting Memory Leaks and Memory Corruption During Production Runs," IEEE Proceedings of the 11th Int'l Symposium on High-Performance Computer Architecture (HPCA-11 2005) 1530-0897/05, 2005; 12 pages.

* cited by examiner

*Primary Examiner* — M. Mujtaba K Chaudry

(57) ABSTRACT

A programmable processing device having a non-volatile memory that may comprise a first memory portion and a second memory portion, where the first section of the first memory portion is configured to store program instructions or data and the second memory portion of the memory word is configured to store either the configuration data or the error detection bits depending upon if an error detection scheme is implemented for the program instructions or data.

16 Claims, 9 Drawing Sheets

USING ECC MEMORY TO STORE CONFIGURATION INFORMATION

CROSS-REFERENCE TO RELATED APPLICATIONS

This application claims the benefit of U.S. Provisional Patent Application No. 61/237,266, filed on Aug. 26, 2009.

TECHNICAL FIELD

This disclosure relates to a processing device and, more particularly, to a memory usage in a programmable processing device.

BACKGROUND

A programmable processing device can be programmed to handle dozens of data acquisition channels and analog or digital inputs and sub-systems. A programmable processing device typically includes a program memory and a flash memory and may include configurable sub-systems. A user needs to program or configure the programmable processing device before its use. The data chosen by the user to configure or functionally prepare the programmable processing device is called configuration data, which is typically stored in the program memory of the programmable processing device. As a result, the available program memory space to the user is reduced due to the storage of the configuration data.

The flash memory of the programmable processing device is typically used to store program instructions. An error detection scheme is generally required for some safety-related programs so that the programmable processing device may take appropriate actions when program memory bit failures have occurred. In order to accommodate the error detection bits computed based on the chosen error detection scheme, the size of the flash memory is increased to store both the program instructions and error detection bits associated with the program instructions.

However, not all programs running at the programmable processing device need to be implemented with an error detection scheme. When a user chooses not to implement any error detection scheme for the program instructions stored in the flash memory of the programmable processing device, the portion of the flash memory space used to store the error detection bits when an error detection scheme is implemented is not used.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram form a in order to avoid unnecessarily obscuring the present invention. Thus, the specific details set forth are merely exemplary. Particular implementations may vary from these exemplary details and still be contemplated to be within the spirit and scope of the present disclosure.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Embodiments of a method and an apparatus are described for a programmable processing device having a non-volatile memory. In one embodiment, each memory word in the non-volatile memory is divided into a first memory portion and a second memory portion. In one embodiment, the first memory portion of the memory word in the non-volatile memory is used to store program instructions or data and the second memory portion of the memory word in the non-volatile memory is used to store either the configuration data or the error detection bits if an error detection scheme is to be implemented for the program instructions or data stored in the first memory portion of the memory word in the non-volatile memory of the programmable processing device. When the second memory portion of the memory word in the non-volatile memory is used to store the error detection bits, the configuration data is stored in the first memory portion of another memory word in the non-volatile memory of the programmable processing device. In one embodiment, the non-volatile memory is a flash memory device.

Figure 1:
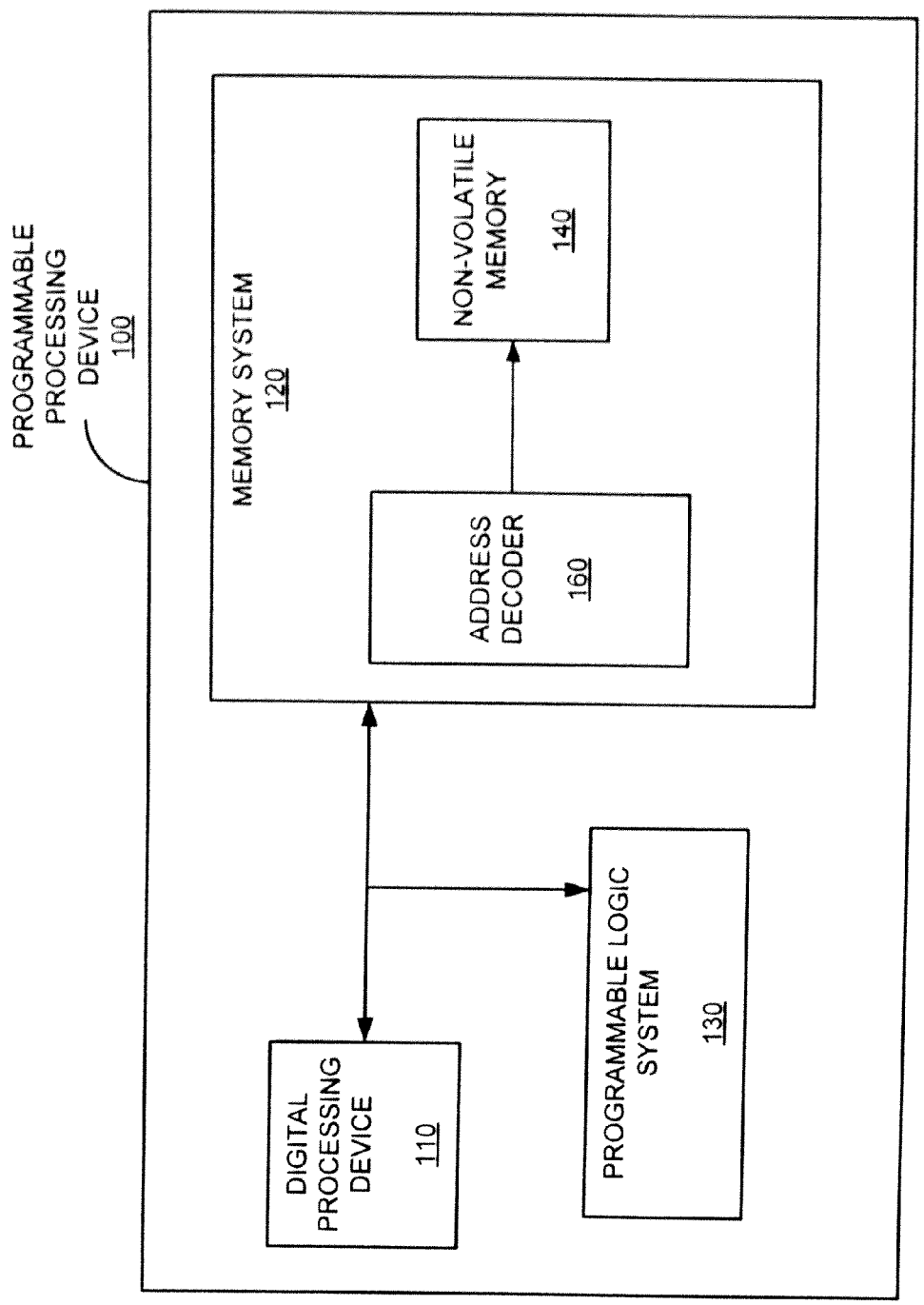
FIG. 1 illustrates a block diagram of one embodiment of a programmable processing device.

FIG. 1 illustrates a block diagram of one embodiment of a programmable processing device 100. The programmable processing device 100 includes a digital processing device 110, a memory system 120, and a programmable logic system 130. The digital processing devices described herein may include one or more general-purpose processing devices such as a microprocessor or central processing unit, a microcontroller, or the like. Alternatively, the digital processing device may include one or more special-purpose processing devices such as a digital signal processor (DSP), an application specific integrated circuit (ASIC), a field programmable gate array (FPGA), or the like. In an alternative embodiment, for example, the digital processing device may be a network processor having multiple processors including a core unit and multiple microengines. Additionally, the digital processing device may include any combination of general-purpose processing devices and special-purpose processing devices.

In one embodiment, the programmable logic system 130 is a programmable digital logic system, which provides unique digital configurability and may be configured to correspond to the specific digital functions desired by a user. In another embodiment, the programmable logic system 130 is a programmable analog logic system, which provides unique analog configurability and may be configured to correspond to the specific analog functions desired by a user. In one embodiment, during the initialization phase of the programmable processing device 100, a user can use a configuration software program to configure or program the programmable logic system 130 with chosen configuration data so that the programmable processing device 100 can deliver the user desired functionality. In one embodiment, a user can also use the configuration software program choose whether an error detection scheme is to be implemented for the program data to be stored in the non-volatile memory device in the memory system 120.

In one embodiment, the memory system 120 includes an address decoder 160, and a non-volatile memory 140. The address decoder 160 is used to address the non volatile memory 140 based on the address inputs received. In one embodiment, the non-volatile memory 140 is a flash memory device configured to store program instructions or data for the programmable processing device 100. In one embodiment, the non-volatile memory 140 is 64 bits wide and no error detection scheme is implemented for the program instructions or data stored in the non-volatile memory 140. In another embodiment, the non-volatile memory 140 is 72 bits wide and an error detection scheme is implemented for the program instructions or data stored in the non-volatile memory 140. Alternatively, the non-volatile memory 140 may have more than 72 bits, such as 128 or 136 bits, or less than 64 bits, as would be appreciated by one of ordinary skill in the art.

In one embodiment, each memory word stored in the non-volatile memory 140 includes a first memory portion and a second memory portion. The first memory portion of the memory word in the non-volatile memory 140 is configured to store program instructions or data and the second memory portion of the memory word in the non-volatile memory 140 is configured to store the device data of the programmable processing device 100, when no error detection scheme is implemented for the program instructions or data stored in the first memory portion of the non-volatile memory 140. The device data stored in the second memory portion of the memory word in the non-volatile memory 140 may include program memory instructions, which may be moved to the first memory portion or other executable memory for execution. In one embodiment, the device data of the programmable processing device 100 is configuration data chosen by a user during the initialization phase of the programmable processing device 100 via the use of the configuration software program. In another embodiment, the device data of the programmable processing device 100 is program data or instructions of the programmable processing device 100. For example, when the size of the non-volatile memory 140 is increased from 64 bits to 72 bits wide to accommodate the possible implementation of an error detection scheme, the increased memory portion in the non-volatile memory 140 may be used to store the configuration data (that would have been stored in the first memory portion of the non-volatile memory 140) of the programmable processing device 100 when no error detection scheme is implemented, which would free up the memory space in the first memory portion of the non-volatile memory 140. In other words, when the increased memory portion of the non-volatile memory 140 is not used to store the error detection bits calculated based on an error detection scheme, the increased memory portion is used to store the device data of the programmable processing device 100. In one embodiment, the device data is the configuration data of the programmable processing device 100.

In one embodiment, the first memory portion of the memory word in the non-volatile memory 140 is configured to store program instructions or data, and the second memory portion of the memory word in the non-volatile memory 140 is configured to store the error detection bits configured to detect or correct the program instruction or data memory bit errors, based on an error detection scheme implemented for the program instruction or data stored in the first memory portion of the memory word in the non-volatile memory 140.

In one embodiment, the address decoder 160 of the memory system 120 is so designed as to allow the first memory portion and the second memory portion of the memory word in the non-volatile memory 140 to be addressed individually. In one embodiment, the second memory portion of the memory word is concatenated with the first memory portion of the memory word and written to the non-volatile memory 140 as a single word. In one embodiment, the first memory portion and the second memory portion of each memory word in the first non-volatile memory 140 can be read out individually.

In one embodiment, the digital processing device 110 is configured to determine whether an error detection scheme is to be implemented for the program instructions or data to be stored in the first non-volatile memory 140, upon receiving the user input during the initialization phase of the programmable processing device 100. In one embodiment, when the digital processing device has determined to implement an error detection scheme for the program instructions or data to be stored in the first memory portion of the memory word in the non-volatile memory 140, the digital processing device 110 includes a primary processor configured to periodically calculate the error detection bits for each program instructions or data to be stored in the first memory portion of the memory word in the non-volatile memory 140 and store the program instructions or data and the calculated error detection bits in the first memory portion and the second memory portion of the memory word in the non-volatile memory 140, respectively. The primary processor of the digital processing device 110 checks the error detection bits when executing the program instructions or data stored in the first memory portion of the memory word in the non-volatile memory 140. In another embodiment, the digital processing device 110 further includes a satellite processor configured to calculate the error detection bits before the primary processor of the digital processing device 110 checks the error detection bits for memory errors when executing the program instruction or data associated with the error detection bits.

In another embodiment, if, upon receiving the user input during the initialization phase of the programmable processing device 100, the digital processing device 110 has determined not to implement an error detection scheme for the program instructions or data to be stored in the first memory portion of the memory word in the non-volatile memory 140, the digital processing device 110 will store the configuration data of the programmable processing device 100 in the second memory portion of the memory word in the non-volatile memory 140. The first memory portion of the memory word in the non-volatile memory 140 is still used to store the program instructions and data.

In one embodiment, the error detection scheme is error correcting code (ECC), based on which ECC bits are calculated and stored in the memory along with the program instructions or data being checked. In one embodiment, the ECC bits are stored in the second memory portion of the memory word in the non-volatile memory 140 and the program instructions or data are stored in the first memory portion of the memory word in the non-volatile memory 140. The second memory portion of the memory word in the non-volatile memory 140 used to store the ECC bits are called ECC memory. In one embodiment, when the program instructions or data stored in the first memory portion of the memory word in the non-volatile memory 140 are read, the corresponding ECC bits stored in the second memory portion of the memory word in the non-volatile memory 140 are read in parallel. The digital processing device 110 will calculate and check the ECC bits read for program instruction or data for program memory bit errors. If a memory bit error has been detected for the program instructions or data associated with the ECC bits checked, a corresponding error flag is set by the digital processing device 110. In other embodiment, other known error detection scheme may be used.

In one embodiment, the second memory portion of the memory word in the non-volatile memory 140 may also be used to store program instructions or data. At the power-up time, the contents stored in the second memory portion of the memory word in the non-volatile memory 140 may be transferred to and executed from another memory device (not shown) in the memory system 120.

In one embodiment, the digital processing device 110 further includes an instruction fetch logic (not shown) configured to operate with different word widths of the non-volatile memory 140, based on whether an error detection scheme is implemented for the program instructions or data stored in the non-volatile memory 140. In one embodiment, the non-volatile memory 140 has a word width of 64 bits with no error detection scheme is implemented. In another embodiment, the non-volatile memory 140 has a word width of 72 bits with an error detection scheme is implemented for the program instructions or data stored in the non-volatile memory 140.

Figure 2A:
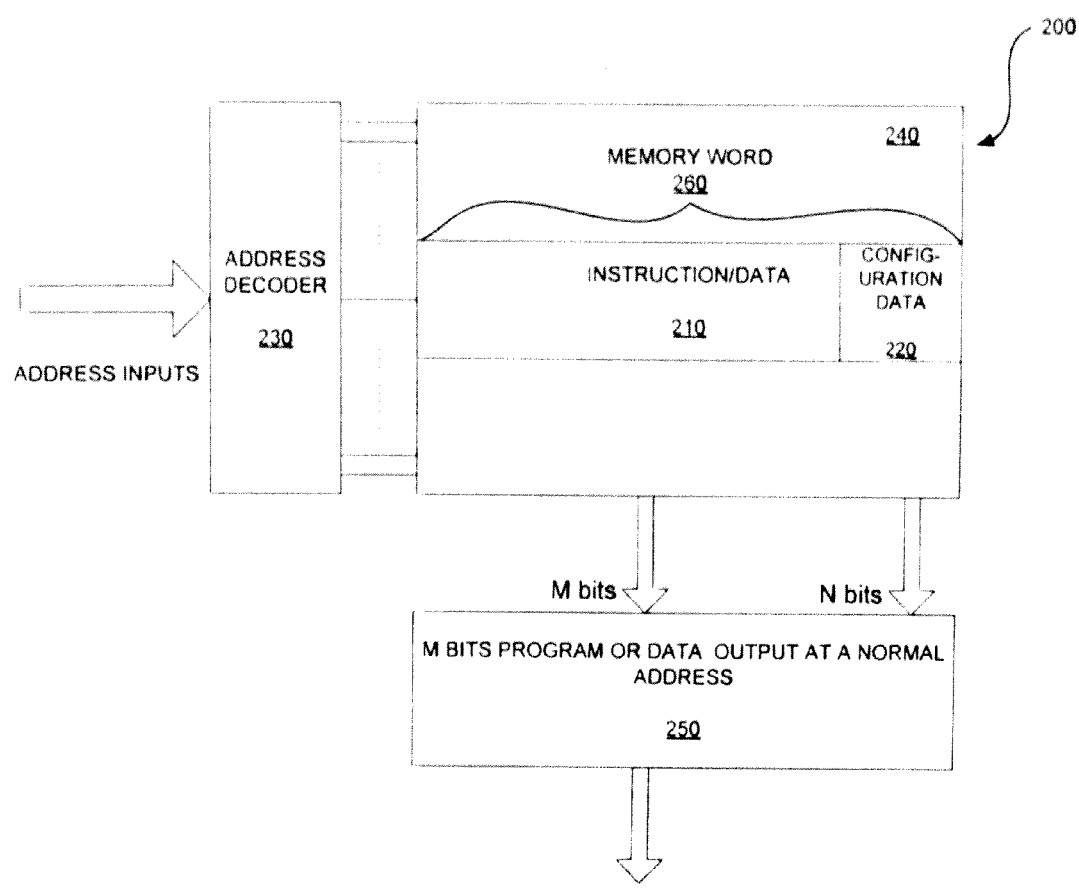
FIG. 2A and FIG. 2B illustrate one embodiment of a memory system in a programmable processing device when no error detection scheme is implemented.
Figure 2B:
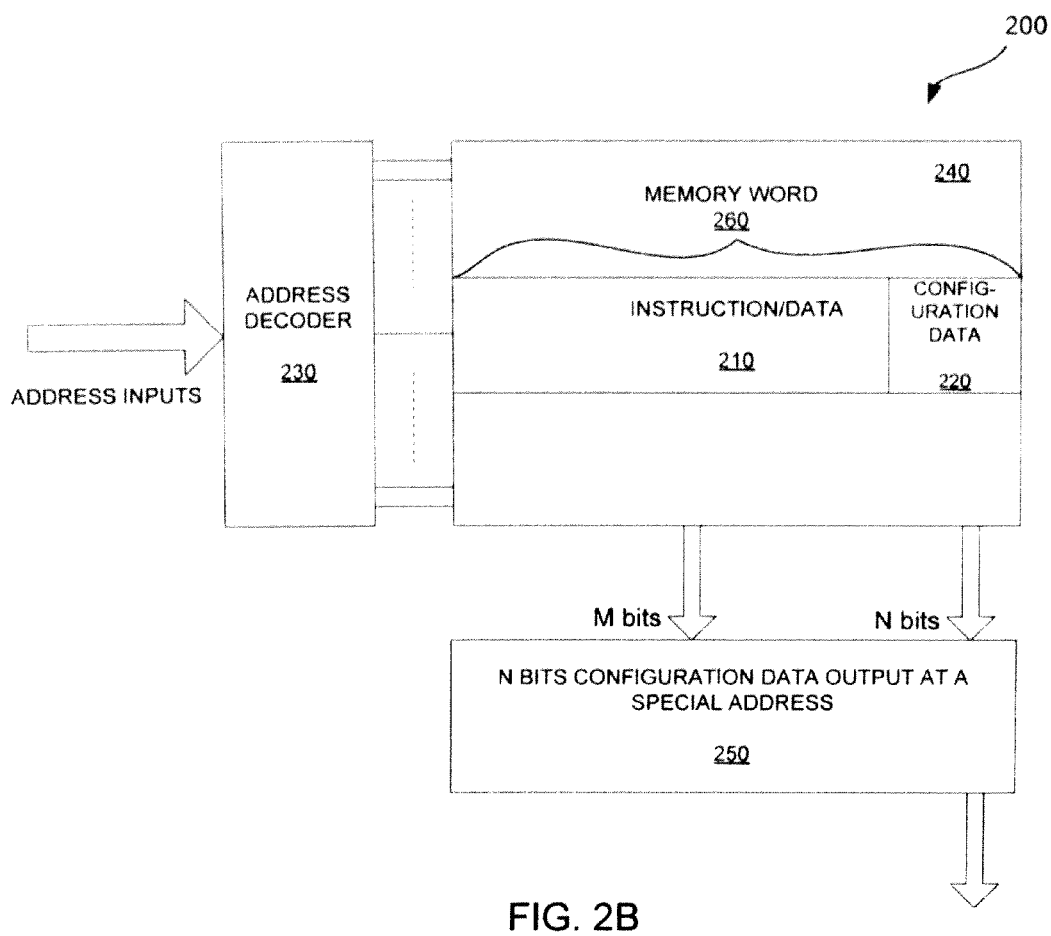

FIG. 2A and FIG. 2B illustrate one embodiment of a memory system 200 in a programmable processing device when no error detection scheme is implemented. As shown, the memory system 200 includes an address decoder 230, a non-volatile memory 240, and a memory map 250. After receiving the address inputs, the address decoder 230 generates an address output that is used to address the memory word 260 stored in the non-volatile memory 240. In one embodiment, each memory word of the non-volatile memory 240 includes a first memory portion 210 and a second memory portion 220, where the first memory portion 210 has M bits and the second memory portion 220 has N bits. In one embodiment, the first memory portion 210 of the non-volatile memory 240 has 64 bits and the second memory portion 220 of the non-volatile memory 240 has 8 bits. The first memory portion 210 is used to store the program instruction or data bits. When no error detection scheme is implemented for the program instruction or data bits stored in the first memory portion 210 of the non-volatile memory 240, the second memory portion 220 of the non-volatile memory 240 is used to store the configuration data (or configuration bits) of the programmable processing device. In one embodiment, the address decoder 230 is so designed as to allow the first memory portion 210 and the second memory portion 220 of the memory word 260 to be addressed individually.

As shown in FIG. 2A, the M bits of the program instruction or data of the memory word 260 stored in the non-volatile memory 240 may be read out to a location at the memory map 250 addressable with a normal address. As shown in FIG. 2B, the N bits of configuration data of the memory word 260 may be read out to a location at the memory map 250 addressable with a special address. In one embodiment, the normal address is located in a normal address space and the special address is located in a special address space, where the normal address space and the special address space are separated. Thus, the digital processing device of the programmable processing device can fetch M bits wide program instructions using a normal address from the normal address space and fetch the N bits wide configuration data using a special address from the special address space. The separation of the memory address spaces makes it possible for the digital processing device to access the stored program instructions sequentially. In one embodiment, the program instructions or data and the configuration data of the memory word 260 are read in parallel. In one embodiment, the memory map 250 includes memory devices. In other embodiment, the memory map 250 includes registers. Alternatively, the memory map may include other resources or devices, as would be appreciated by one of ordinary skill in the art having the benefit of this disclosure.

Figure 3:
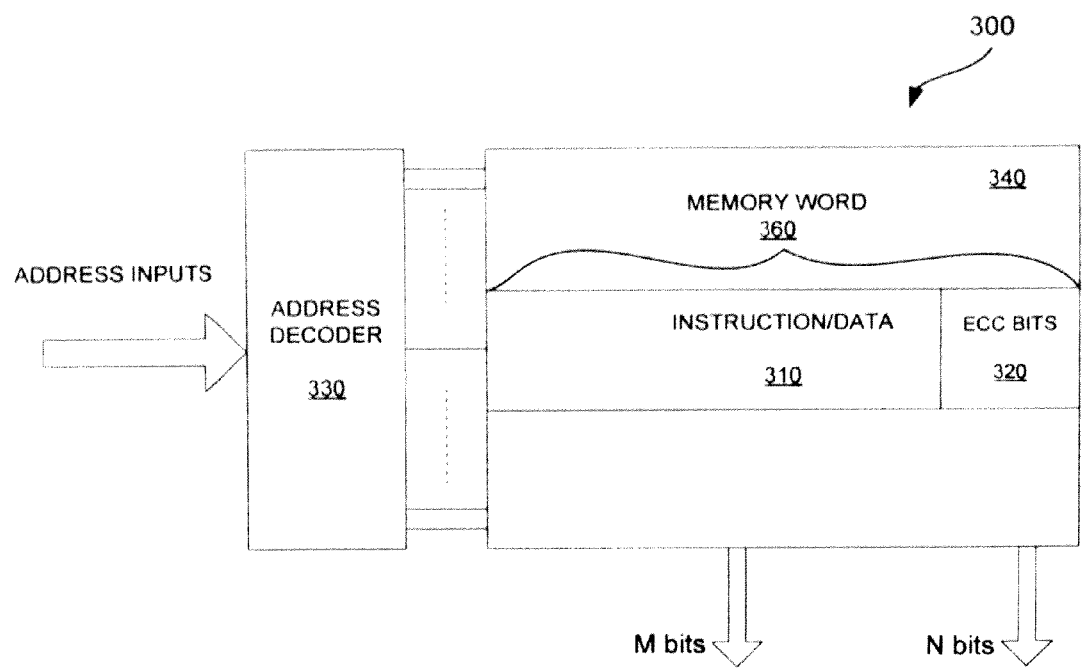
FIG. 3 illustrates one embodiment of a memory system in a programmable processing device when an error detection scheme is implemented.

FIG. 3 illustrates one embodiment of a memory system 300 in a programmable processing device when an error detection scheme is implemented. The memory system 300 includes an address decoder 330 and a non-volatile memory 340. After receiving the address inputs from the programmable processing device, the address decoder 330 outputs an address that is used to address the memory word 360 in the non-volatile memory 340. Each memory word in the non-volatile memory 340 has M+N bits, where the M bits are used to store a program instruction or data and the N bits are used to store the error detection bits.

In one embodiment, each memory word in the non-volatile memory 340 includes a first memory portion and a second memory portion, where the first memory portion 310 of the memory word 360 is configured to store program instruction or data and the second memory portion 320 of the memory word 360 is configured to store the error detection bits, which are calculated based on the chosen error detection scheme used to detect or correct the memory bits errors for the program instruction or data stored in the first memory portion 310 of the memory word 360.

In one embodiment, the non-volatile memory 340 is a flash memory device. In one embodiment, the first memory portion 310 of the memory word 360 has M bits and the second memory portion 320 of the memory word 360 has N bits. In one embodiment, the memory word 360 has 72 bits, where the first memory portion 310 of the memory word 360 has 64 bits and the second memory portion 320 of the memory word 360 has 8 bits.

In one embodiment, the error detection scheme is ECC and the error detection bits are ECC bits. ECC can correct all single-bit errors and detect all double-bit errors in the program instructions or data. In one embodiment, the program instruction or data bits and the ECC bits stored in the memory word 360 are read in parallel. In one embodiment, the bit ratio between the first memory portion 310 and the second memory portion 320 of the memory word 360 is 8:1 when the ECC is implemented for the program instructions or data stored in the first memory portion 310 of the memory word 360 in the non-volatile memory 340. Alternatively, other ratio between the first memory portion 310 and the second memory portion 320 of the memory word 360 may be implemented depending upon the chosen error detection scheme and the width of the memory word 360, as would be appreciated by one of ordinary skill in the art.

Figure 4:
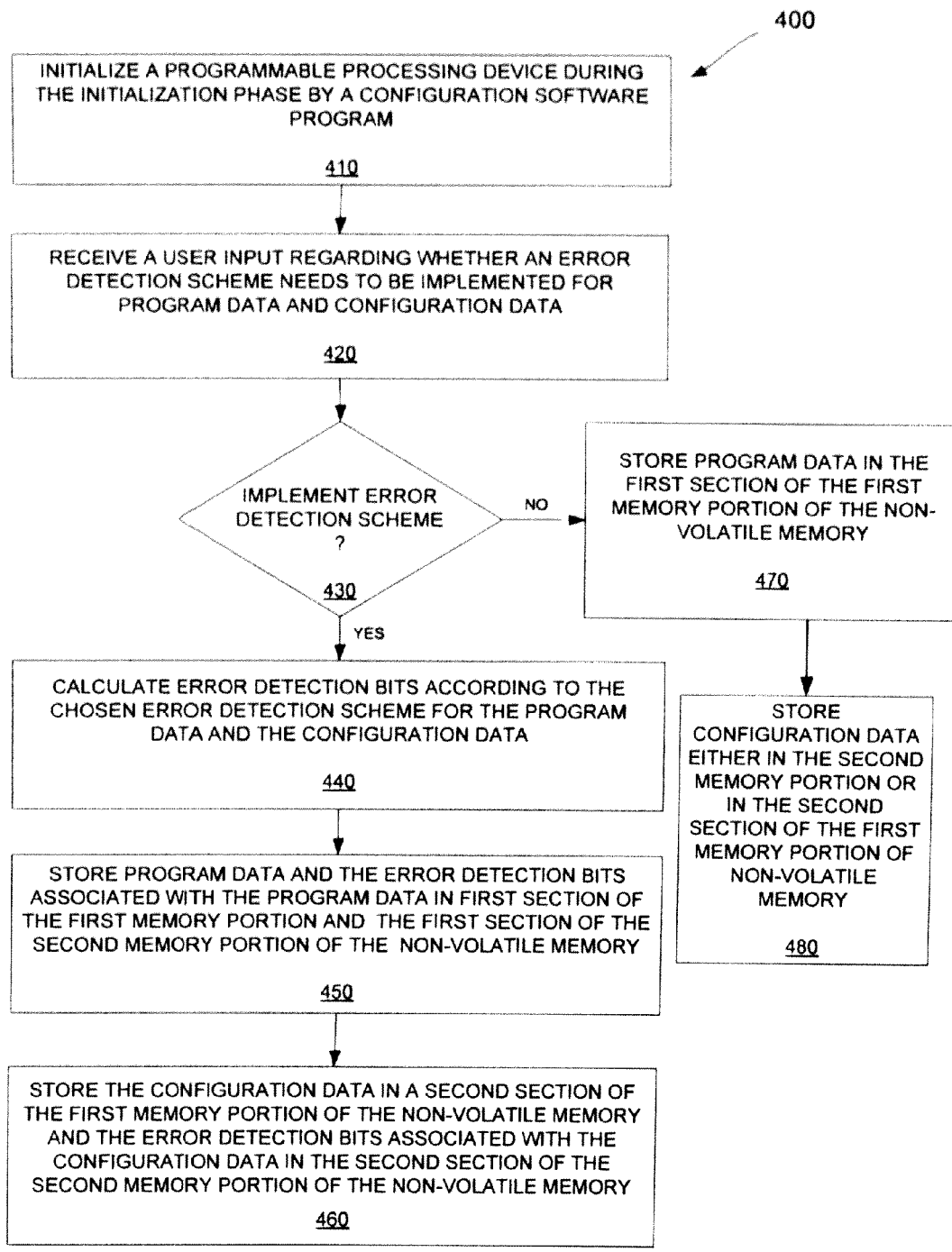
FIG. 4 is a flowchart illustrating one embodiment of a method of storing configuration data in a non-volatile memory in a programmable processing device.

FIG. 4 is a flowchart 400 illustrating one embodiment of a method of storing configuration data in a non-volatile memory in a programmable processing device. In block 410, the programmable processing device is initialized during the initialization phase by a configuration software program. The data chosen by a user to configure the programmable processing device via running the configuration software program is called the configuration data. In block 420, the programmable processing device receives a user input during the initialization phrase while running the configuration software regarding whether an error detection scheme is to be implemented for the program data and the configuration data. In one embodiment, the programmable processing device comprises a pre-programmed non-volatile memory array that is programmed by the Cypress PSoC® Creator before any user programming is implemented for the programmable processing device. The pre-programmed non-volatile memory array allows certain user choices, including the selection of the error detection scheme, to be made by a user before running any user programs. In one embodiment, the default choice for the error detection scheme is ECC. Alternatively, other error detection schemes can be implemented for the programmable processing device, as would be appreciated by one of ordinary skill in the art. In block 430, the digital processing device of the programmable processing device determines whether an error detection scheme is to be implemented based on the received user input.

Once the digital processing device of the programmable processing device determines that an error detection scheme is to be implemented for the program data and the configuration data, in block 440, the digital processing device of the programmable processing device calculates the error detection hits according to the chosen error detection scheme for the program data and the configuration data. In one embodiment, the error detection scheme is ECC and the error detection bits are ECC bits. In block 450, the program data and the error detection bits associated with the program data are respectively stored in the first section of the first memory portion and a first section of the second memory portion of the non-volatile memory. In one embodiment, the first memory portion and the second memory portion of the non-volatile memory of the programmable processing device can be addressed individually.

In one embodiment, when the error detection scheme is not selected for the program data, the first memory portion and the second memory portion of the non-volatile memory are a data memory portion and a reserved memory portion, respectively. An address decoder coupled to the non-volatile memory and a processing device is configured to address the data memory portion and the reserved memory portion of the non-volatile memory individually. The processing device is configured to store device data to the reserved memory portion and to store the program data to a first section of the data memory portion of the non-volatile memory. When the size of the device data is larger than the size of the reserved memory portion of the non-volatile memory, the processing device is further configured to store the overflow of the device data to a second section of the data memory portion of the non-volatile memory.

In block 460, the configuration data is stored in a second section of the first memory portion of the non-volatile memory of the programmable processing device and the error detection hits associated with the configuration data is stored in the second section of the second memory portion of the non-volatile memory.

Once the digital processing device of the programmable processing device determines that an error detection scheme is not to be implemented for the program data and the configuration data, in block 470, the program data may be stored in the first section of the first memory portion of the non-volatile memory. In block 480, the configuration data is stored either in the second memory portion of the non-volatile memory or in the second section of the first memory portion of the non-volatile memory. In one embodiment, when the storage of the configuration data starts with the second memory portion and the size of the configuration data is larger than the size of the second memory portion of the non-volatile memory, after the second memory portion of the non-volatile memory is full, the remaining configuration data, or the overflow of the configuration data, may be stored in the second section of the first memory portion of the non-volatile memory. In one embodiment, the configuration data is stored in the second section of the first memory portion of the non-volatile memory, and the second memory portion of the non-volatile memory is unused.

Figure 5A:
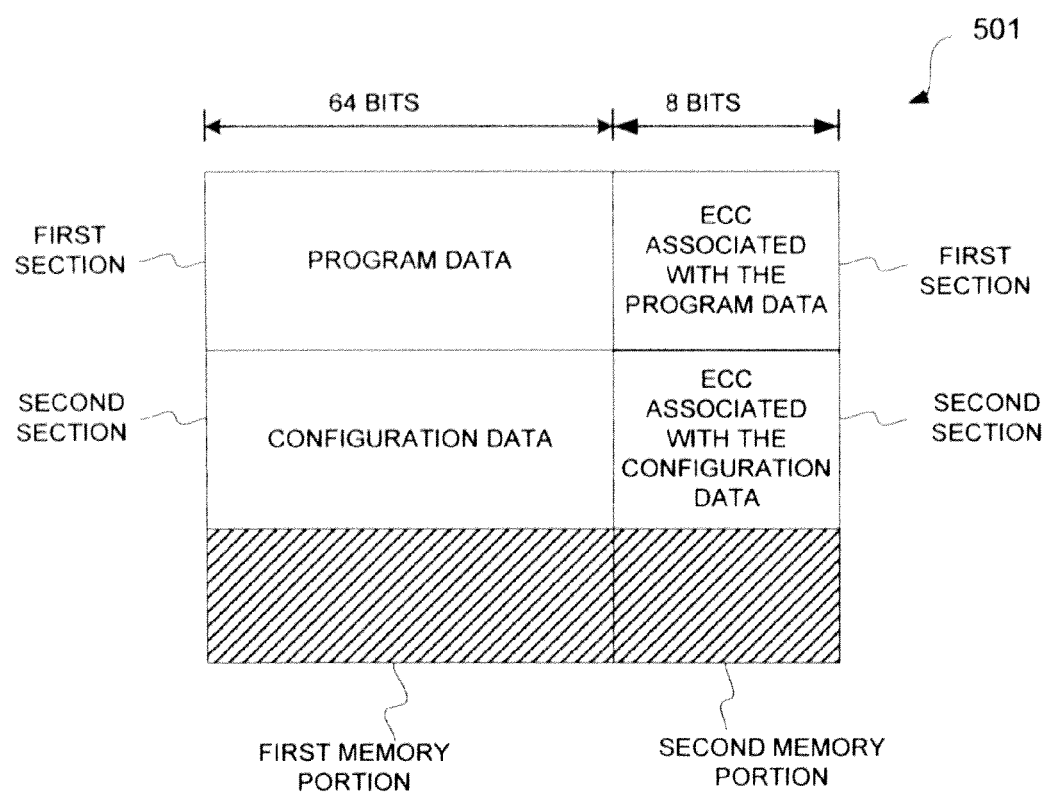
FIG. 5A illustrates one embodiment of a memory system in a programmable processing device when an error detection scheme is implemented.

FIG. 5A illustrates one embodiment of a memory system in a programmable processing device when the ECC is implemented. As shown, the non-volatile memory 501 has 64K bytes of 64 bits wide first memory portion and 8K bytes of 8 bits wide second memory portion. The first section of the first memory portion of the non-volatile memory 501 may be used to store the program data. In one embodiment, the program data is stored contiguously in the first section of the first memory portion of the non-volatile memory 501. The second section of the first memory portion of the non-volatile memory 501 is used to store the configuration data. In one embodiment, the ECC bits are generated by a processing device for every 64-bit word, including the configuration data, stored in the first memory portion of the non-volatile memory 501. The generated ECC bits are stored in the second memory portion of the non-volatile memory 501. The shaded area indicates the unused memory portions.

Figure 5B:
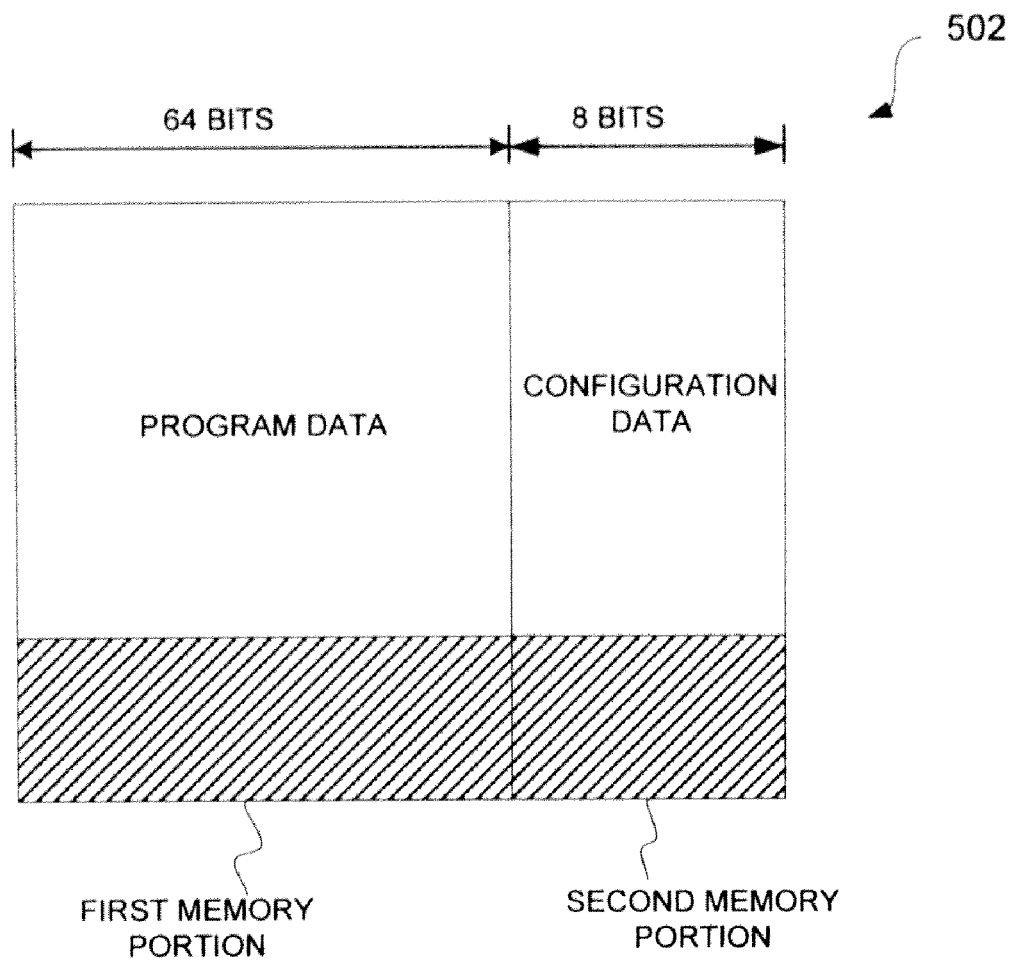
FIG. 5B illustrates one embodiment of a memory system a programmable processing device when no error detection scheme is implemented.

FIG. 5B illustrates one embodiment of a memory system in a programmable processing device when no error detection scheme is implemented. As shown, the non-volatile memory 502 has 64K bytes of 64 bits wide first memory portion and 8K bytes of 8 bits wide second memory portion. The first memory portion in the non-volatile memory 502 is used to store the program data, and the second memory portion in the non-volatile memory 502 is used to store the configuration data. The shaded area indicates the unused memory portions.

Figure 5C:
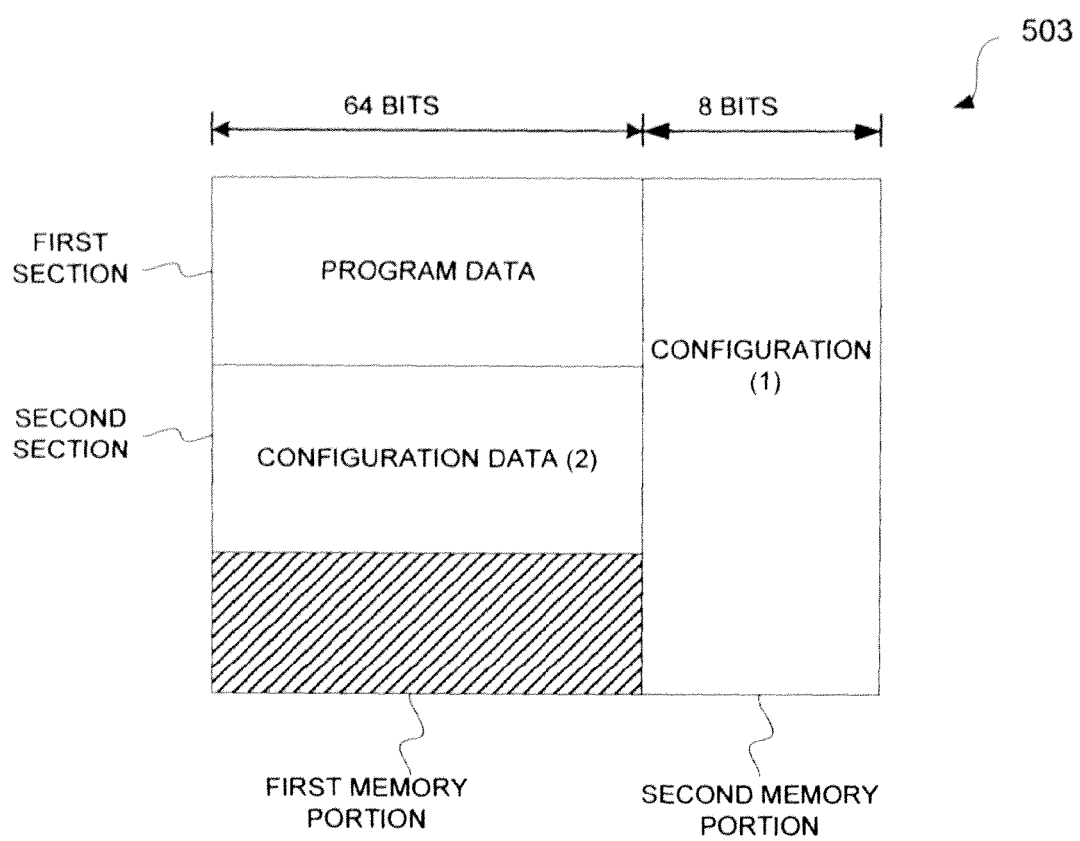
FIG. 5C illustrates one embodiment of a memory system in a programmable processing device when no error detection scheme is implemented.

FIG. 5C illustrates one embodiment of a memory system in a programmable processing device when no error detection scheme is implemented. As shown, the non-volatile memory 503 has 64K bytes of 64 bits wide first memory portion and 8K bytes of 8 bits wide second memory portion. The first section of the first memory portion of the non-volatile memory 503 is used to store the program data. The entire second memory portion of the non-volatile memory 503 is used to store the first portion of the configuration data and the second section of the first memory portion of the non-volatile memory 503 is used to store the second portion, i.e., the overflow, of the configuration data. For example, when the configuration memory is 13K bytes that exceeds the 8K bytes of the second memory portion, the remaining 5K of the 13K configuration data will be stored in the second section of the first memory portion of the non-volatile memory 503. The shaded area indicates the unused memory portions.

Figure 5D:
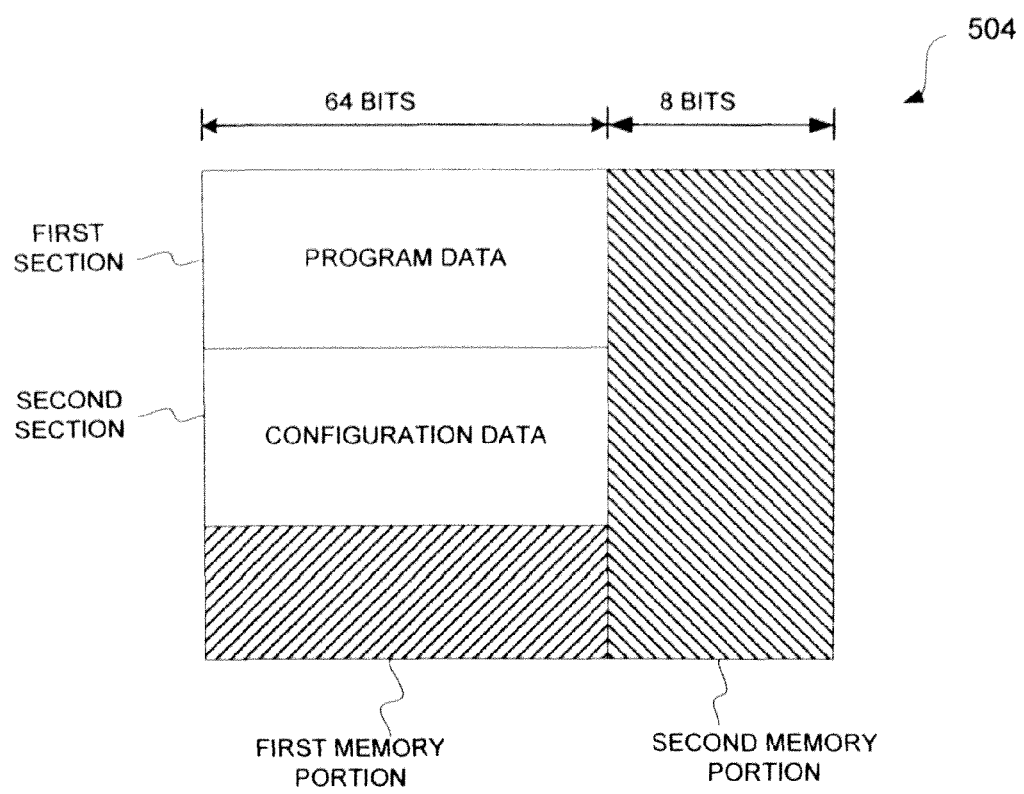
FIG. 5D illustrates one embodiment of a memory system in a programmable processing device when no error detection scheme is implemented.

FIG. 5D illustrates one embodiment of a memory system in a programmable processing device when no error detection scheme is implemented. As shown, the non-volatile memory 504 has 64K bytes of 64 bits wide first memory portion and 8K bytes of 8 bits wide second memory portion. The first section of the first memory portion in the non-volatile memory 504 is used to store program data and the second section of the first memory portion in the non-volatile memory 504 is used to store configuration data. The entire second memory portion of the non-volatile memory 504 is not used.

Embodiments, described herein, include various operations. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alliteratively be one or more single signal lines and each of the single signal lines may alternatively be buses.

Certain embodiments may be implemented as a computer program product that may include instructions stored on a computer-readable storage medium. These instructions may be used to program a general-purpose or special-purpose processor to perform the described operations. The computer-readable storage medium may include, but is not limited to, magnetic storage medium; optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing a set of instructions for execution by the machine and that causes the machine to perform any one or more of the methodologies of the present embodiments. Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:
receiving, by a programmable processing device, an input indicating whether an error detection scheme is selected for program data to be stored in a first memory portion of a non-volatile memory of the programmable processing device;
allocating a second memory portion of the non-volatile memory for storage of error detection bits associated with the program data when the error detection scheme is selected; and
allocating the second memory portion of the non-volatile memory for storage of device data of the programmable processing device when the error detection scheme is not selected, wherein the device data is different than the error detection bits associated with the program data.

2. The method of claim 1, wherein the device data is configuration data chosen by a user during an initialization phase of the programmable processing device.

3. The method of claim 1, further comprising:
calculating the error detection bits associated with the program data according to the error detection scheme when the error detection scheme is selected;
storing the program data in a first section of the first memory portion of the non-volatile memory; and
storing the calculated error detection bits associated with the program data in a first section of the second memory portion of the non-volatile memory.

4. The method of claim 3, further comprising:
calculating the error detection bits associated with the device data according to the error detection scheme when the error detection scheme is selected;
storing the device data of the programmable processing device in a second section of the first memory portion of the non-volatile memory; and
storing the calculated error detection bits associated with the device data in a second section of the second memory portion of the non-volatile memory.

5. The method of claim 1, further comprising:
storing the program data in a first section of the first memory portion of the non-volatile memory; and
storing the device data of the programmable processing device in the second memory portion of the non-volatile memory when the error detection scheme is not selected.

6. The method of claim 5, further comprising:
storing overflow of the device data of the programmable processing device in a second section of the first memory portion of the non-volatile memory, when a size of the device data is larger than a size of the second memory portion of the non-volatile memory.

7. The method of claim 1, further comprising:
storing the program data in a first section of the first memory portion of the non-volatile memory; and
storing the device data of the programmable processing device in a second section of the first memory portion of the non-volatile memory when the error detection scheme is not selected.

8. A computer readable storage medium including instructions that, when executed by a processor, cause the processor to perform a method comprising:
causing a programmable processing device to receive an input indicating whether an error detection scheme is selected for program data to be stored in a first memory portion of a non-volatile memory of the programmable processing device;
allocating a second memory portion of the non-volatile memory for storage of error detection bits associated with the program data when the error detection scheme is selected; and
allocating the second memory portion of the non-volatile memory for storage of device data of the programmable processing device when the error detection scheme is not selected, wherein the device data is different than the error detection bits associated with the program data.

9. The computer readable storage medium of claim 8, further comprising instructions which, when executed, cause:
calculating the error detection bits according to the error detection scheme when the error detection scheme is selected;
storing the program data in a first section of the first memory portion of the non-volatile memory; and
storing the calculated error detection bits associated with the program data in a first section of the second memory portion of the non-volatile memory.

10. The computer readable storage medium of claim 9, further comprising instructions which, when executed, cause:
storing the device data of the programmable processing device in a second section of the first memory portion of the non-volatile memory.

11. The computer readable storage medium of claim 8, further comprising instructions which, when executed, cause:
storing the program data in the first memory portion of the non-volatile memory; and
storing the device data of the programmable processing device in the second memory portion of the non-volatile memory when the error detection scheme is not selected.

12. An apparatus, comprising:
a non-volatile memory having a first memory portion and a second memory portion;
a processing device coupled to the non-volatile memory;
wherein, when an error detection scheme is selected for program data to be stored in the first memory portion, the second memory portion of the non-volatile memory is configured by the processing device to store error detection bits associated with the program data to be stored in the first memory portion;
wherein, when the error detection scheme is not selected, the second memory portion of the non-volatile memory is configured by the processing device to store device data of the processing device;
wherein the device data is different than the error detection bits associated with the program data.

13. The apparatus of claim 12, wherein the device data is configuration data chosen by a user during an initialization phase of the processing device.

14. The apparatus of claim 12, further comprising:
an address decoder coupled to the non-volatile memory and to the processing device, wherein the address decoder is configured to address the first memory portion and the second memory portion of the non-volatile memory individually.

15. The apparatus of claim 12, wherein the error detection scheme comprises error-correction codes (ECC).

16. The apparatus of claim 12, wherein a bit ratio between the first memory portion and the second memory portion of the non-volatile memory is 8:1.

* * * * *